(12) United States Patent
Nam et al.

(10) Patent No.: US 8,735,027 B2
(45) Date of Patent: May 27, 2014

(54) PHOTOSENSITIVE RESIN COMPOSITION FOR COLOR FILTER AND COLOR FILTER USING THE SAME

(75) Inventors: Seong-Ryong Nam, Uiwang-si (KR);
Taek-Jin Baek, Uiwang-si (KR);
Yeon-Soo Lee, Uiwang-si (KR);
Chang-Min Lee, Uiwang-si (KR);
Sang-Won Cho, Uiwang-si (KR);
Won-A Noh, Uiwang-si (KR);
Gyu-Seok Han, Uiwang-si (KR);
Han-Chul Hwang, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 72 days.

(21) Appl. No.: 13/591,651

(22) Filed: Aug. 22, 2012

(65) Prior Publication Data
US 2013/0164678 A1 Jun. 27, 2013

(30) Foreign Application Priority Data

Dec. 26, 2011 (KR) .................. 10-2011-0142408

(51) Int. Cl.
*G03F 7/004* (2006.01)
*G02B 5/20* (2006.01)

(52) U.S. Cl.
USPC .......................................... 430/7; 430/281.1

(58) Field of Classification Search
None
See application file for complete search history.

(56) References Cited

U.S. PATENT DOCUMENTS

| 6,124,425 | A  | * | 9/2000 | Nguyen ...................... 528/422 |
| 6,509,125 | B1 | * | 1/2003 | Ito et al. ........................ 430/7 |
| 6,677,113 | B2 |   | 1/2004 | Kagawa et al. |
| 2002/0106593 | A1 | | 8/2002 | Kagawa et al. |
| 2012/0242940 | A1 | * | 9/2012 | Nagata et al. ................. 349/106 |

FOREIGN PATENT DOCUMENTS

| JP | 2000-321704 | 11/2000 |
| JP | 3501425 | 12/2003 |
| KR | 10-2010-0098882 A | 9/2010 |

* cited by examiner

*Primary Examiner* — John A. McPherson
(74) *Attorney, Agent, or Firm* — Additon, Higgins, Pendleton & Ashe, P.A.

(57) ABSTRACT

Disclosed are a photosensitive resin composition for a color filter and a color filter using the same. The photosensitive resin composition for a color filter includes (A) a dye-polymer composite including a structural unit derived from a compound represented by the following Chemical Formula 1; (B) an acrylic-based photopolymerizable monomer; (C) a photopolymerization initiator; and (D) a solvent.

[Chemical Formula 1]

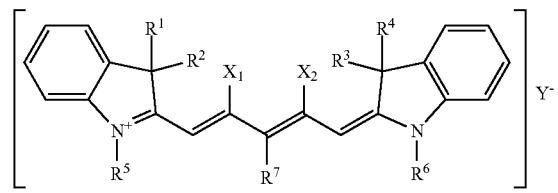

In Chemical Formula 1, each substituent is the same as defined in the detailed description.

12 Claims, No Drawings

PHOTOSENSITIVE RESIN COMPOSITION FOR COLOR FILTER AND COLOR FILTER USING THE SAME

CROSS-REFERENCE TO RELATED APPLICATIONS

This application claims priority to and the benefit of Korean Patent Application No. 10-2011-0142408 filed in the Korean Intellectual Property Office on Dec. 26, 2011, the entire disclosure of which is incorporated herein by reference.

FIELD

A photosensitive resin composition for a color filter and a color filter using the same are disclosed.

BACKGROUND

A color filter is used for a liquid crystal display (LCD), an optical filter for a camera, and the like. A color filter can be fabricated by coating a fine region colored with three or more colors on a charge coupled device or a transparent substrate. The colored thin film can be commonly fabricated by dyeing, printing, electrophoretic deposition (EPD), pigment dispersion, and the like.

The color filter is prepared through many chemical treatments during the manufacturing process. Accordingly, in order to maintain a pattern formed under the aforementioned condition, a color photosensitive resin is required to have a development margin but chemical resistance and thus to improve yield of a color filter.

When a liquid crystal display device is fabricated in a color filter-on-array (COA) method of forming a color filter on a TFT array panel, a transparent electrode needs to be formed on the color filter. The transparent electrode may be fabricated by sequentially forming a transparent conductive layer and a photosensitive resin film on a color filter, exposing and developing the photosensitive resin film, patterning it, and etching the transparent conductive layer using the patterned photosensitive resin film. The color filter is exposed to various chemical solutions such as a stripper and the like and thus should have strong chemical resistance.

In addition, the color filter is typically subjected to a plurality of heat treatment processes and thus should have strong heat resistance.

SUMMARY

One embodiment provides a photosensitive resin composition that can have improved heat resistance and chemical resistance.

Another embodiment provides a color filter using the photosensitive resin composition.

According to one embodiment, provided is a photosensitive resin composition for a color filter that includes (A) a dye-polymer composite including a structural unit derived from a compound represented by the following Chemical Formula 1, (B) acrylic-based photopolymerizable monomer, (C) a photopolymerization initiator, and (D) a solvent.

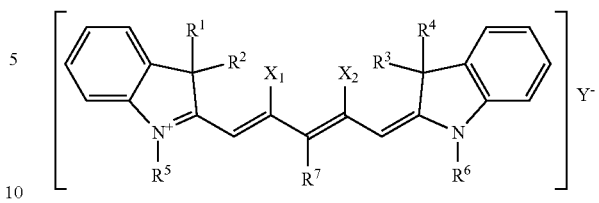

[Chemical Formula 1]

In Chemical Formula 1, $X_1$ and $X_2$ are the same or different and are each independently alkyl; cycloalkyl; an alkyl alcohol group; a carboxylic acid group; an alkenyl alcohol group; an alkyl carboxylic acid group; or an alkenyl carboxylic acid group, or $X_1$ and $X_2$ are linked to each other to form a C3 to C15 hydrocarbon ring, $R^1$ to $R^4$ are the same or different and are each independently substituted or unsubstituted alkyl; alkenyl; alkynyl; cycloalkyl; cycloalkenyl; cycloalkynyl; or aryl, and $R^5$ to $R^7$ are the same or different and are each independently halogen, a carboxylic acid group; an alkyl halogen; a sulfonic acid group; an alkylsulfonic acid group; an alkenylsulfonic acid group; sulfoneimide group; an alkylsulfoneimide group; an alkylalcohol group; an alkenyl alcohol group; an alkyl carboxylic acid group; an alkenyl carboxylic acid group; alkoxy alkylsulfonic acid group; an alkoxy alkenyl sulfonic acid group; an alkoxy alkynyl sulfonic acid group; an alkoxy alkyl carboxylic acid group; an alkoxy alkenyl carboxylic acid group; or alkoxy alkynyl carboxylic acid group, provided that at least one of $R^5$ and $R^6$ includes a functional group represented by the following Chemical Formula 2 at the terminal end,

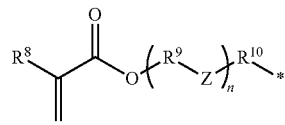

[Chemical Formula 2]

wherein, in Chemical Formula 2, $R^8$ is hydrogen or substituted or unsubstituted C1 to C30 alkyl, $R^9$ is substituted or unsubstituted C1 to C30 alkylene, $R^{10}$ is a single bond or substituted or unsubstituted C1 to C30 alkyl, Z is —N(H)—, —S—, or —O—, n is an integer ranging from 0 to 10, and $Y^-$ is a counter ion of $N^+$.

The photosensitive resin composition for a color filter may include about 0.1 to about 50 wt % of the dye-polymer composite (A) including a structural unit derived from a compound represented by the above Chemical Formula 1; about 0.5 to about 20 wt % of the acrylic-based photopolymerizable monomer (B); about 0.1 to about 10 wt % of the photopolymerization initiator (C); and balance of the solvent (D).

The dye-polymer composite (A) may have a weight average molecular weight (Mw) of about 1,000 to about 500,000.

The dye-polymer composite (A) may include at least one of the structural units represented by the following Chemical Formulae 3 to 5, or a combination thereof.

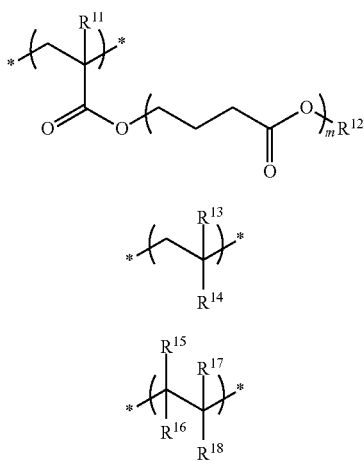

[Chemical Formula 3]

[Chemical Formula 4]

[Chemical Formula 5]

In Chemical Formulae 3 to 5, $R^{11}$, $R^{12}$, $R^{13}$, $R^{15}$ and $R^{16}$ are the same or different and are each independently hydrogen, substituted or unsubstituted C1 to C30 alkyl, substituted or unsubstituted C6 to C30 aryl, substituted or unsubstituted C6 to C30 alkylaryl, or a combination thereof, $R^{14}$ is substituted or unsubstituted C1 to C30 alkyl, substituted or unsubstituted C6 to C30 aryl, —CO—$R^{19}$—COOH (wherein $R^{19}$ is substituted or unsubstituted C1 to C30 alkylene or substituted or unsubstituted C1 to C30 alkoxylene), or a combination thereof, $R^{17}$ is —COOH or —CONH$R^{20}$ (wherein $R^{20}$ is substituted or unsubstituted C1 to C30 alkyl or substituted or unsubstituted C6 to C30 aryl), $R^{18}$ is —COOH, or $R^{17}$ and $R^{18}$ are fused to each other to form a ring, and m is an integer of 0 to 5.

The dye-polymer composite (A) may include the above Chemical Formulae 3 to 5 in amounts of o, p and q moles, respectively, and the o, p, and q can be in the following ranges: 0≤o≤80, 0≤p≤80, and 0≤q≤80.

The dye-polymer composite (A) may include at least one of the structural units represented by the above Chemical Formulae 3 to 5 in an amount of about 0.1 to about 50 wt % based on the total amount (weight) of the dye-polymer composite (A).

The photosensitive resin composition for a color filter may further include a pigment, a dye, or a combination thereof.

The photosensitive resin composition for a color filter may further include an acrylic-based binder resin. The photosensitive resin composition may include the acrylic-based binder resin in an amount of about 1 to about 20 wt % based on the total amount (weight) of the photosensitive resin composition for a color filter.

The photosensitive resin composition for a color filter may further include at least one additive such as a dispersing agent; an epoxy compound; malonic acid; 3-amino-1,2-propanediol; a silane-based coupling agent with a vinyl group or a (meth)acryloxy group; a leveling agent; a silicon-based surfactant; a fluorine-based surfactant; a radical polymerization initiator, or a mixture thereof.

According to another embodiment, a color filter manufactured using the photosensitive resin composition for a color filter is provided.

The photosensitive resin composition for a color filter can have excellent heat and chemical resistance and may provide a color filter having high contrast ratio and luminescence characteristics.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a definition is not otherwise provided, the term "alkyl" may refer to C1 to C30 alkyl, the term "alkenyl" may refer to C2 to C20 alkenyl, the term "alkynyl" may refer to C2 to C20 alkynyl, the term "alkoxy" may refer to C1 to C30 alkoxy, the term "cycloalkyl" may refer to C3 to C30 cycloalkyl, the term "cycloalkenyl" may refer to C3 to C40 cycloalkenyl, the term "cycloalkynyl" may refer to C3 to C40 cycloalkynyl, the term "aryl" may refer to C6 to C30 aryl, the term "arylalkyl" may refer to C7 to C30 arylalkyl, the term "alkylene" may refer to C1 to C20 alkylene, and the term "alkoxylene" may refer to C1 to C20 alkoxylene.

As used herein, when a definition is not otherwise provided, the term "substituted" may refer to one substituted with halogen (F, Cl, Br, or I), hydroxyl, a nitro group, a cyano group, an imino group (=NH, =NR, wherein R is C1 to C10 alkyl), an amino group (—NH$_2$, —NH(R'), —N(R") (R'")), wherein R' to R'" are the same or different and are each independently C1 to C10 alkyl), an amidino group, a hydrazine or hydrazone group, a carboxyl group, substituted or unsubstituted C1 to C30 alkyl, substituted or unsubstituted C6 to C30 aryl, substituted or unsubstituted C3 to C30 cycloalkyl, substituted or unsubstituted C3 to C30 heteroaryl substituted or unsubstituted C2 to C30 heterocycloalkyl, or a combination thereof, instead of at least one hydrogen in a functional group.

As used herein, when a definition is not otherwise provided, the term "hetero" may refer to one substituted with at least one heteroatom including N, O, S, P, or a combination thereof.

As used herein, when a definition is not otherwise provided, the term "combination thereof" may refer at least two substituents linked to each other through a single bond and or a linking group, or at least two substituents condensed or fused to each other.

As used herein, "*" denotes a position linked to the same or different atom or chemical formula.

The photosensitive resin composition for a color filter according to one embodiment includes (A) a dye-polymer composite including a structural unit derived from a compound represented by the above Chemical Formula 1, (B) an acrylic-based photopolymerizable monomer, (C) a photopolymerization initiator and (D) a solvent.

Hereinafter, each component of the photosensitive resin composition according to one embodiment is described in detail.

However, the following descriptions are only exemplary but do not limit the present invention.

(A) Dye-polymer Composite

The dye-polymer composite (A) included in the photosensitive resin composition for a color filter includes a structural unit derived from a compound represented by the following Chemical Formula 1.

[Chemical Formula 1]

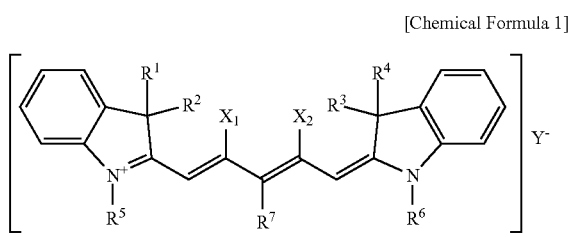

In Chemical Formula 1, $X_1$ and $X_2$ are the same or different and are each independently alkyl; cycloalkyl; an alkyl alcohol group; a carboxylic acid group; an alkenyl alcohol group; an alkyl carboxylic acid group; an alkenyl carboxylic acid group, or $X_1$ and $X_2$ are linked to each other to form a C3 to C15 hydrocarbon ring, $R^1$ to $R^4$ are each independently substituted or unsubstituted alkyl; alkenyl; alkynyl; cycloalkyl; cycloalkenyl; cycloalkynyl; or aryl, and $R^5$ to $R^7$ are each independently halogen, a carboxylic acid group; an alkyl halogen; a sulfonic acid group; an alkylsulfonic acid group; an alkenylsulfonic acid group; sulfoneimide group; an alkylsulfoneimide group; an alkylalcohol group; an alkenyl alcohol group; an alkyl carboxylic acid group; an alkenyl carboxylic acid group; alkoxy alkylsulfonic acid group; an alkoxy alkenyl sulfonic acid group; an alkoxy alkynyl sulfonic acid group; an alkoxy alkyl carboxylic acid group; an alkoxy alkenyl carboxylic acid group; or alkoxy alkynyl carboxylic acid group, provided that at least one of $R^5$ and $R^6$ includes a functional group represented by the following Chemical Formula 2 at the terminal end,

[Chemical Formula 2]

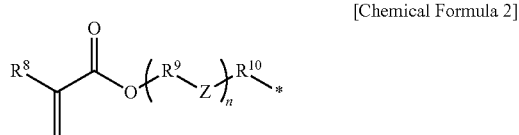

$R^8$ is hydrogen or substituted or unsubstituted C1 to C30 alkyl, $R^9$ is substituted or unsubstituted C1 to C30 alkylene, $R^{10}$ is a single bond or substituted or unsubstituted C1 to C30 alkyl, Z is —N(H)—, —S—, or —O—, n is an integer ranging from 0 to 10, and $Y^-$ is a counter ion of $N^+$.

In one embodiment, Y— may be $F^-$, $Br^-$, $Cl^-$, $I^-$, perchlorate, hexafluorophosphate, or sulfoneimide group.

According to one embodiment, the dye-polymer composite (A) may be prepared by copolymerizing a compound represented by the above Chemical Formula 1 with another monomer copolymerizable therewith. Since the dye-polymer composite (A) has a high molecular weight by copolymerizing a dye such as the compound represented by the above Chemical Formula 1 and the like with another monomer copolymerizable therewith, a dye having a low molecular weight and the like may not be extracted in water or an organic solvent, thereby fabricating a color filter having excellent heat and chemical resistance.

The photosensitive resin composition may include the dye-polymer composite (A) in an amount of about 0.5 to about 50 wt %, for example about 1 to about 30 wt %, based on the total amount (weight) of the photosensitive resin composition for a color filter. In some embodiments, the photosensitive resin composition may include the dye-polymer composite (A) in an amount of about 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the dye-polymer composite (A) can be in a range from about any of the foregoing amounts to about any other of the foregoing amounts.

When the dye-polymer composite (A) is used in an amount within the above range, the composition may have excellent developability in alkali, excellent cross-linking and thus, less surface roughness, excellent chemical resistance but minimal or no stripped pattern, and minimal or no color change in an organic solvent.

The dye-polymer composite (A) may further include a structural unit derived from a first ethylenic unsaturated monomer and a structural unit derived a second ethylenic unsaturated monomer copolymerizable therewith, along with the structural unit derived from the compound represented by the above Chemical Formula 1.

The first ethylenic unsaturated monomer is an ethylenic unsaturated monomer including at least one carboxyl group. Examples of the first ethylenic unsaturated monomer may include without limitation acrylic acid, methacrylic acid, maleic acid, itaconic acid, fumaric acid, and the like, and combinations thereof.

The dye-polymer composite may include the first ethylenic unsaturated monomer in an amount of about 1 to about 50 wt %, for example about 3 to about 40 wt %, and as another example about 5 to about 30 wt %, based on the total amount (weight) of monomers forming the dye-polymer composite. In some embodiments, the dye-polymer composite may include the first ethylenic unsaturated monomer in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation alkenyl aromatic monomers, unsaturated carbonic acid ester compounds, unsaturated carbonic acid amino alkyl ester compounds, carbonic acid vinyl ester compounds, unsaturated carbonic acid glycidyl ester compounds, vinyl cyanide compounds, unsaturated amide compounds, and the like, and combinations thereof.

Examples of the alkenyl aromatic monomers may include without limitation styrene, α-methyl styrene, vinyl toluene, vinyl benzyl methylether, and the like, and combinations thereof. Examples of the unsaturated carbonic acid ester compounds may include without limitation methyl acrylate, methyl methacrylate, ethyl acrylate, ethyl methacrylate, butyl acrylate, butyl methacrylate, 2-hydroxy ethyl acrylate, 2-hydroxy ethyl methacrylate, 2-hydroxy butyl acrylate, 2-hydroxy butyl methacrylate, benzyl acrylate, benzyl methacrylate, cyclohexyl acrylate, cyclohexyl methacrylate, phenyl acrylate, phenyl methacrylate, and the like, and combinations thereof. Examples of the unsaturated carbonic acid amino alkyl ester compounds may include without limitation 2-amino ethyl acrylate, 2-amino ethyl methacrylate, 2-dimethyl amino ethyl acrylate, 2-dimethyl amino ethyl methacrylate, and the like, and combinations thereof. Examples of the carbonic acid vinyl ester compounds may include without limitation vinyl acetate, vinyl benzoate, and the like, and combinations thereof. Examples of the unsaturated carbonic acid glycidyl ester compounds may include without limitation glycidyl acrylate, glycidyl methacrylate, and the like, and combinations thereof. Examples of the vinyl cyanide compounds may include without limitation acrylonitrile, methacrylonitrile, and the like, and combinations thereof. Examples of the unsaturated amide compounds may include without limitation acrylamide, methacrylamide, and the like, and combinations thereof. The second ethylenic unsaturated monomer are may be used singularly or as a mixture of two or more.

According to one embodiment, the dye-polymer composite (A) may include at least one of the structural units represented by the following Chemical Formulae 3 to 5, or a combination thereof. The dye-polymer composite (A) according to this embodiment can provides a color filter having a fine pattern and excellent heat and chemical resistance.

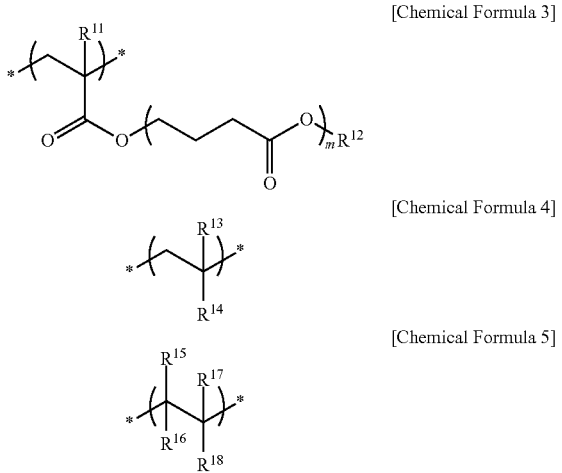

[Chemical Formula 3]

[Chemical Formula 4]

[Chemical Formula 5]

In Chemical Formulae 3 to 5, $R^{11}$, $R^{12}$, $R^{13}$, $R^{15}$, and $R^{16}$ are the same or different and are each independently hydrogen or substituted or unsubstituted C1 to C30 alkyl, substituted or unsubstituted C6 to C30 aryl, substituted or unsubstituted C6 to C30 alkylaryl, or a combination thereof, $R^{14}$ is substituted or unsubstituted C1 to C30 alkyl, substituted or unsubstituted C6 to C30 aryl, —CO—$R^{19}$—COOH (wherein $R^{19}$ is substituted or unsubstituted C1 to C30 alkylene or substituted or unsubstituted C1 to C30 alkoxylene), or a combination thereof, $R^{17}$ is —COOH or —CONH$R^{20}$ (wherein $R^{20}$ is substituted or unsubstituted C1 to C30 alkyl or substituted or unsubstituted C6 to C30 aryl), $R^{18}$ is —COOH, or $R^{17}$ and $R^{18}$ are fused to each other to form a ring, and m is an integer of 0 to 5.

The dye-polymer composite (A) may include at least one structural unit represented the above Chemical Formulae 3 to 5 in amounts of o, p and q moles, respectively, wherein the o, p, and q are in the following ranges: $0 \leq o \leq 80$, $0 \leq p \leq 80$, and $0 \leq q \leq 80$.

In some embodiments, the dye-polymer composite (A) may include the structural unit represented by the above Chemical Formula 3 in an amount of 0 (the structural unit of Chemical Formula 3 is not present), about 0 (the structural unit of Chemical Formula 3 is present), 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 mol %. Further, according to some embodiments of the present invention, the amount of the structural unit represented by the above Chemical Formula 3 can be in a range from about any of the foregoing amounts to about any other of the foregoing amounts.

In some embodiments, the dye-polymer composite (A) may include the structural unit represented by the above Chemical Formula 4 in an amount of 0 (the structural unit of Chemical Formula 4 is not present), about 0 (the structural unit of Chemical Formula 4 is present), 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 mol %. Further, according to some embodiments of the present invention, the amount of the structural unit represented by the above Chemical Formula 4 can be in a range from about any of the foregoing amounts to about any other of the foregoing amounts.

In some embodiments, the dye-polymer composite (A) may include the structural unit represented by the above Chemical Formula 5 in an amount of 0 (the structural unit of Chemical Formula 5 is not present), about 0 (the structural unit of Chemical Formula 5 is present), 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 mol %. Further, according to some embodiments of the present invention, the amount of the structural unit represented by the above Chemical Formula 5 can be in a range from about any of the foregoing amounts to about any other of the foregoing amounts.

When the structural units represented by the above Chemical Formulae 3 to 5 are used in amounts within the above mole ratio ranges, appropriate developability and heat and chemical resistance may be secured.

The dye-polymer composite (A) may include at least one of the structural units represented by the above Chemical Formulae 3 to 5 in an amount of about 0.1 to about 50 wt %, for example about 20 to about 40 wt %, based on the total amount (weight) of the dye-polymer composite (A). In some embodiments, the dye-polymer composite (A) may include at least one of the structural units represented by the above Chemical Formulae 3 to 5 in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the at least one of the structural units represented by the above Chemical Formulae 3 to 5 can be in a range from about any of the foregoing amounts to about any other of the foregoing amounts.

When at least one of the structural units of Chemical Formulas 3 to 5 is included in an amount within the above ranges, a fabricated color filter may have remarkably improved chemical and chemical resistance and excellent pattern stability but no light transmission deterioration.

The dye-polymer composite (A) may have a weight average molecular weight (Mw) of about 1,000 to about 500,000, for example about 5,000 to about 30,000. When the dye-polymer composite (A) has too large a weight average molecular weight (Mw), it can be hard to synthesize a photosensitive resin composition, and a compound represented by Chemical Formula 1 may be deposited.

In addition, the dye-polymer composite (A) may have an acid value ranging from about 0 to about 300 mgKOH/g, for example about 50 to about 200 mgKOH/g. When the dye-polymer composite (A) has a weight average molecular weight and an acid value within the above ranges, excellent developability may be accomplished.

In addition, the amount of a structural unit derived from a compound represented by Chemical Formula 1 included in the dye-polymer composite (A) may be appropriately adjusted depending on the purpose or end use of the composite. The dye-polymer composite (A) may include the structural unit derived from the compound represented by the above Chemical Formula 1 in an amount of about 0.1 to about 50 wt %, for example about 1 to about 40 wt %, based on the entire amount (weight) of the dye-polymer composite (A). In some embodiments, the dye-polymer composite (A) may include the structural unit derived from the compound represented by the above Chemical Formula 1 in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the structural unit derived from the compound represented by the above Chemical Formula 1 can be in a range from about any of the foregoing amounts to about any other of the foregoing amounts.

When the structural unit derived from the compound represented by the above Chemical Formula 1 is included in an amount within the above range, a dye may not only be deposited due to the excessive amount but excellent chemical and heat resistance may be accomplished.

The dye-polymer composite (A) may have a degree of cross-linking determined by a ratio between an acrylic-based photopolymerizable monomer and a photopolymerization initiator described hereinafter. Accordingly, the degree of cross-linking may be controlled by adjusting a ratio between the acrylic-based photopolymerizable monomer and the photopolymerization initiator.

(B) Acrylic-based Photopolymerizable Monomer

The acrylic-based photopolymerizable monomer may be a photopolymerizable monomer which is generally used in a photosensitive resin composition.

Examples of the photopolymerizable monomer may include without limitation ethyleneglycol di(meth)acrylate, diethyleneglycol di(meth)acrylate, triethyleneglycol di(meth)acrylate, propyleneglycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth)acrylate, pentaerythritol penta(meth)acrylate, pentaerythritol hexa(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, bisphenol A di(meth)acrylate, trimethylolpropane tri(meth)acrylate, novolacepoxy(meth)acrylate, a dipentaerythritol penta(meth)acrylate derivative including a carboxylic acid group, ethyleneoxide glycerine trimethylolpropanetri(meth)acrylate, propyleneoxide glycerine tri(meth)acrylate, and the like, and combinations thereof.

Since the photopolymerizable monomer may tend to react with cyclic ether and have improved solvent resistance, the photopolymerizable monomer may have a carboxylic acid group. Examples of the photopolymerizable monomer including a carboxylic acid group may include without limitation esters of a hydroxyl group-containing (meth)acrylate and polyvalent carboxylic acid; esters of a hydroxyl group-containing (meth)acrylate and polyvalent carboxylic acid anhydride; and the like, and combinations thereof.

Examples of the hydroxyl group-containing (meth)acrylate may include without limitation trimethylolpropane di(meth)acrylate, glycerine di(meth)acrylate, pentaerythritol tri(meth)acrylate, dipentaerythritol penta(meth)acrylate, and the like, and combinations thereof.

Examples of the polyvalent carboxylic acid may include without limitation aromatic polyvalent carboxylic acids such as phthalic acid, 3,4-dimethylphthalic acid, isophthalic acid, terephthalic acid, pyromellitic acid, trimellitic acid, 1,4,5,8-naphthalenetetracarboxylic acid, 3,3',4,4'-benzophenonetetracarboxylic acid, and the like; aliphatic polyvalent carboxylic acids such as succinic acid, glutaric acid, sebacic acid, 1,2,3,4-butanetetracarboxylic acid, maleic acid, fumaric acid, itaconic acid, and the like; alicyclic polyvalent carboxylic acids such as hexahydrophthalic acid, 3,4-dimethyltetrahydrophthalic acid, hexahydroisophthalic acid, hexahydroterephthalic acid, 1,2,4-cyclopentanetricarboxylic acid, 1,2,4-cyclohexanetricarboxylic acid, cyclopentanetetracarboxylic acid, 1,2,4,5-cyclohexane, tetracarboxylic acid, and the like; and the like; and combinations thereof.

Examples of the polyvalent carboxylic acid anhydride may include without limitation aromatic polyvalent carboxylic acid anhydrides such as anhydrous phthalic acid, anhydrous pyromellitic acid, anhydrous trimellitic acid, 3,3',4,4'-benzophenonetetracarboxylic acid dianhydride, and the like; aliphatic polyvalent carboxylic acid anhydrides such as itaconic anhydride, anhydrous succinic acid, anhydrous citraconic acid, anhydrous dodecenylsuccinic acid, anhydrous tricarballylic acid, maleic anhydride, 1,2,3,4-butanetetracarboxylic acid dianhydride, and the like; alicyclic polyvalent carboxylic acid anhydride such as anhydrous hexahydrophthalic acid, 3,4-dimethyltetrahydrophthalic acid anhydride, 1,2,4-cyclopentanetricarboxylic acid anhydride, 1,2,4-cyclohexanetricarboxylic acid anhydride, cyclopentanetetracarboxylic acid dianhydride, 1,2,4,5-cyclohexanetetracarboxylic acid dianhydride, himic anhydride, nadic anhydride, and the like; ester group-containing carboxylic acid anhydrides such as ethyleneglycol bistri mellitic acid, glycerine tristrimellitic anhydride, and the like; and the like; and combinations thereof.

Examples of the carboxyl group-containing photopolymerizable monomer may include without limitation phthalic acid esters of trimethylolpropane di(meth)acrylate, succinic acid esters of glycerine di(meth)acrylate, phthalic acid esters of pentaerythritol tri(meth)acrylate, succinic acid esters of pentaerythritol triacrylate, phthalic acid esters of dipentaerythritol penta(meth)acrylate, succinic acid esters of dipentaerythritol penta(meth)acrylate, and the like, and combinations thereof.

The photosensitive resin composition may include the acrylic-based photopolymerizable monomer in an amount of about 0.5 to about 20 wt %, based on the total amount (weight) of the photosensitive resin composition for a color filter. In some embodiments, the photosensitive resin composition may include the acrylic-based photopolymerizable monomer in an amount of about 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments of the present invention, the amount of the acrylic-based photopolymerizable monomer can be in a range from about any of the foregoing amounts to about any other of the foregoing amounts.

When the acrylic-based photopolymerizable monomer is included in an amount within the above range, a pattern may have a neat edge and good developing property in an alkali developing solution.

(C) Photopolymerization Initiator

Examples of the photopolymerization initiator may include without limitation triazine-based compounds, acetophenone-based compounds, biimidazole-based compounds, benzoin-based compounds, benzophenone-based compounds, thioxanthone-based compounds, oxime-based compounds, and the like, and combinations thereof.

Examples of the triazine-based compound may include without limitation 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, 2,4-bis(trichloromethyl)-6-[2-(3,4-dimethoxyphenyl)ethenyl]-1,3,5-triazine, 2,4-bis(trichloromethyl)-6-piperonyl)-1,3,5-triazine, 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, bis(trichloro methyl)-6-styryl-s-triazine, 2-(naphto-1-yl)-4,6-bis(trichloro methyl)-s-triazine, 2-(4-methoxy naphto-1-yl)-4,6-bis(trichloro methyl)-s-triazine, 2-4-trichloro methyl (piperonyl)-6-triazine, 2-4-trichloro methyl (4'-methoxy styryl)-6-triazine, and the like, and combinations thereof. In one embodiment, 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine or 2,4-bis(trichloromethyl)-6-piperonyl-1,3,5-triazine may be used, and in another embodiment, 2,4-bis(trichloromethyl)-6-piperonyl-1,3,5-triazine may be used.

Examples of the acetophenone-based compound may include without limitation diethoxyacetophenone, 2-methyl-2-morpholino-1-(4-methylthiophenyl)propan-1-one, 2-hydroxy-2-methyl-1-phenylpropan-1-one, benzyldimethylketal, 2-hydroxy-2-methyl-1-[4-(2-hydroxyethoxy)phenyl]propan-1-one, 1-hydroxycyclohexylphenylketone, 2-benzyl-2-dimethylamino-1-(4-morpholinophenyl)butan-1-one, 2-(4-methylbenzyl)-2-dimethylamino-1-(4-morpholinophenyl)butan-1-one, 2-hydroxy-2-methyl-1-[4-(1-methylvinyl)phenyl]propan-1-one, and the like, and combinations thereof. In one embodiment, 2-methyl-2-morpholino-1-(4-methylthiophenyl)propan-1-one, 2-benzyl-2-dimethylamino-1-(4-morpholinophenyl)butan-1-one or 2-(4-methylbenzyl)-2-dimethyl amino-1-(4-morpholinophenyl)butan-1-one, for example, 2-benzyl-2-dimethylamino-1-(4-morpholinophenyl)butan-1-one or 2-(4-methylbenzyl)-2-dimethylamino-1-(4-morpholinophenyl)butan-1-one may be used.

Examples of the biimidazole-based compound may include without limitation 2,2'-bis(2-chlorophenyl)-4,4',5,5'-tetraphenylbiimidazole, 2,2'-bis(2-chlorophenyl)-4,4',5,5'-tetra(4-carboethoxyphenyl)biimidazole, 2,2',-bis(2-chlorophenyl)-4,4',5,5'-tetra(4-bromophenyl)biimidazole, 2,2'-bis(2-chlorophenyl)-4,4',5,5'-tetra(2,4-dichlorophenyl) biimidazole, 2,2'-bis(2-bromophenyl)-4,4',5,5'-tetraphenylbiimidazole, 2,2'-bis(2,4-dichlorophenyl)-4,4',5,5'-tetraphenylbiimidazole, 2,2'-bis(2-chlorophenyl)-4,4',5,5'-tetra(m-methoxyphenyl)biimidazole, 2,2'-bis(2,3-dichlorophenyl)-4,4',5,5'-tetraphenylbiimidazole, 2,2'-bis(2,6-dichlorophenyl)-4,4',5,5'-tetraphenylbiimidazole, 2,2'-bis(2-nitrophenyl)-4,4',5,5'-tetraphenylbiimidazole, 2,2'-bis(2-methylphenyl)-4,4',5,5'-tetraphenylbiimidazole, and the like, and combinations thereof. In one embodiment, 2,2'-bis(2-chlorophenyl)-4,4',5,5'-tetraphenylbiimidazole or 2,2'-bis(2,3-dichlorophenyl)-4,4',5,5'-tetraphenylbiimidazole may be used.

Examples of the benzoin-based compound may include without limitation benzoin, benzoin methylether, benzoin ethylether, benzoin isopropylether, benzoin isobutylether, benzyldimethylketal, and the like, and combinations thereof.

Examples of the benzophenone-based compound may include without limitation benzophenone, benzoyl benzoate, o-benzoyl methyl benzoate, 4-phenyl benzophenone, hydroxy benzophenone, acrylated benzophenone, 3,3'-dimethyl-2-methoxy benzophenone, 4,4'-dichloro benzophenone, 4,4'-bis(dimethylamino)benzophenone, 4,4'-bis(diethylamino)benzophenone, 4-benzoyl-4'-methyldiphenylsulfide, 3,3',4,4'-tetra(tert-butylperoxycarbonyl)benzophenone, 2,4,6-trimethylbenzophenone, and the like, and combinations thereof.

Examples of the thioxanthone-based compound may include without limitation thioxanthone, 2-methyl thioxanthone, 2-isopropyl thioxanthone, 4-isopropyl thioxanthone, 2,4-diethyl thioxanthone, 2,4-diisopropyl thioxanthone, 2-chloro thioxanthone, 1-chloro-4-propoxythioxanone, and the like, and combinations thereof.

Examples of the oxime-based compound may include without limitation o-acyloxime-based compounds, 2-(o-benzoyloxime)-1-[4-(phenylthio)phenyl]-1,2-octadione, 1-(o-acetyloxime)-1-[9-ethyl-6-(2-methylbenzoyl)-9H-carbazol-3-yl]ethanone, o-ethoxycarbonyl-α-oxyamino-1-phenylpropan-1-one, and the like, and combinations thereof. Examples of the o-acyloxime-based compounds include without limitation 1-(4-phenylsulfanylphenyl)-butan-1,2-dione 2-oxime-o-benzoate, 1-(4-phenylsulfanylphenyl)-octane-1,2-dione 2-oxime-o-benzoate, 1-(4-phenylsulfanylphenyl)-octan-1-oneoxime-o-acetate, 1-(4-phenylsulfanylphenyl)-butan-1-oneoxime-o-acetate, and the like, and combinations thereof.

Other examples of the photopolymerization initiator may include without limitation carbazole-based compounds, diketone series compounds, sulfonium borate-based compounds, diazo-based compounds, and the like, and combinations thereof, besides the compounds described above.

The photopolymerization initiator absorbs light and is excited and then transmits energy, and it may be used with a photo-sensitizer causing a chemical reaction.

The photosensitive resin composition may include the photopolymerization initiator in an amount of about 0.1 to about 10 wt %, based on the total amount (weight) of the photosensitive resin composition for a color filter. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photopolymerization initiator is included in an amount within the above range, it may bring about sufficient photopolymerization in the patterning process, while not deteriorating transmittance due to non-reacting initiator remnants.

The degree of cross-linking caused by the dye-polymer composite (A) can be determined based on the composition ratio of the acrylic-based photopolymerizable monomer (B) and the photopolymerization initiator (C), and accordingly the degree of cross-linking may be controlled by adjusting the composition ratio of the acrylic-based photopolymerizable monomer (B) and the photopolymerization initiator (C).

(D) Solvent

The solvent is required to have compatibility with the dye-polymer composite (A) and other component materials but does not have a reaction therewith.

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxy alkyl acetate esters such as oxy methyl acetate, oxy ethyl acetate, oxy butyl acetate, and the like; alkoxy alkyl acetate esters such as methoxy methyl acetate, methoxy ethyl acetate, methoxy butyl acetate, ethoxy methyl acetate, ethoxy ethyl acetate, and the like; 3-oxy alkyl propionate esters such as 3-oxy methyl propionate, 3-oxy ethyl propionate, and the like; 3-alkoxy alkyl propionate esters such as 3-methoxy methyl propionate, 3-methoxy ethyl propionate, 3-ethoxy ethyl propionate, 3-ethoxy methyl propionate, and the like; 2-oxy alkyl propionate esters such as 2-oxy methyl propionate, 2-oxy ethyl propionate, 2-oxy propyl propionate, and the like; 2-alkoxy alkyl propionate esters such as 2-methoxy methyl propionate, 2-methoxy ethyl propionate, 2-ethoxy ethyl propionate, 2-ethoxy methyl propionate, and the like; 2-oxy-2-methyl propionate esters such as 2-oxy-2-methyl methyl propionate, 2-oxy-2-methyl ethyl propionate, and the like; 2-alkoxy-2-methyl alkyl propionates of monooxy monocarboxylic acid alkyl esters such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanote, and the like; ketone acid esters such as ethyl pyruvate, and the like; a solvent having a high boiling point such as N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, carbonate ethylene, carbonate propylene, phenyl cellosolve acetate, and the like, and combinations thereof.

In one embodiment, considering compatibility and reactivity, glycol ethers such as ethylene glycol monoethyl ether, and the like; ethylene glycol alkylether acetates such as ethyl cellosolve acetate, and the like; esters such as 2-hydroxy ethyl propionate, and the like; diethylene glycols such as diethylene glycol monomethyl ether, and the like; propylene glycol alkylether acetates such as propylene glycol methylether acetate, propylene glycol propylether acetate, and the like may be used. Considering solubility of a dye, cyclohexanone may be used in an amount of about 10 to about 80 parts by weight based on about 100 parts by weight of a solvent. These solvents may be used singularly or as a mixture of two or more.

The solvent is used in a balance amount, for example about 20 to about 90 wt %. In some embodiments, the photosensitive resin composition may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of solvent can be in a range from about any of the foregoing amounts to about any other of the foregoing amounts.

When the solvent is present in an amount within the above range, the photosensitive resin composition can have good coating property, and flatness at a thickness of greater than or equal to 1 μm may be maintained.

(E) Other Colorant

The photosensitive resin composition for a color filter may further include a colorant of a pigment, a dye, or a combination thereof besides the dye-polymer composite (A) in order to implement color characteristics.

The pigment may have a color such as red, green, blue, yellow, violet, and the like. Examples of the pigment may include without limitation condensed polycyclic pigments such as anthraquinone-based pigments, perylene-based pigments, and the like, phthalocyanine-based pigments, azo-based pigments, and the like. The pigments can be used singularly or in a combination of two or more. Two or more pigments may be combined for adjusting maximum absorption wavelength, cross point, crosstalk, and the like.

The pigment may be dispersed in a solvent to be prepared in form of a pigment dispersion and be included in the photosensitive resin composition for a color filter.

In order to disperse the pigment in the pigment dispersion uniformly, a dispersing agent may be used as needed. For this purpose, a non-ionic, anionic, or cationic dispersing agent may be used. Examples of the dispersing agent may include without limitation polyalkyleneglycols and esters thereof, polyoxyalkylenes, polyhydric alcohol ester alkylene oxide addition products, alcohol alkyleneoxide addition products, sulfonic acid esters, sulfonates, carboxylic acid esters, carboxylates, alkylamidealkyleneoxide addition products, alkylamines, and the like. These dispersing agents may be used singularly or as a mixture of two or more.

Along with the dispersing agent, a carboxyl group-containing first acrylic-based resin may be added to the pigment dispersion to improve stability of the dispersion and pattern formation of pixels.

The pigment may have a primary particle diameter ranging from about 10 nm to about 80 nm, for example about 10 nm to about 70 nm. When the particle diameter is within the above ranges, a pigment dispersion solution may have excellent stability but not deteriorate pixel resolution.

Examples of the dye may include without limitation anthraquinone-based compounds, cyanine-based compounds, mesocyanine-based compounds, azaporphyrin-based compounds, phthalocyanine-based compounds, pyrrolopyrrole-based compounds, diazo-based compounds, carbonium-based compounds, acridine-based compounds, thiazole-based compounds, quinomine-based compounds, methine-based compounds, quinoline-based compounds, and the like, and the like, and combinations thereof.

When the dispersion including the pigment and dye is used, the pigment and dye may be used in an amount of about 1:9 to about 9:1.

In some embodiments, the combination of the pigment and the dye may include the pigment in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the pigment can be in a range from about any of the foregoing amounts to about any other of the foregoing amounts.

In some embodiments, the combination of the pigment and the dye may include the dye in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the dye can be in a range from about any of the foregoing amounts to about any other of the foregoing amounts.

When the pigment and the dye are used in an amount within the above ranges, high luminance and contrast ratio and desirable color characteristics may be realized.

The photosensitive resin composition may include the pigment and/or dye in an amount of about 0.1 to about 40 wt %, based on the total amount (weight) of the photosensitive resin composition for a color filter. In some embodiments, the photosensitive resin composition may include the pigment and/or dye in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the pigment and/or dye can be in a range from about any of the foregoing amounts to about any other of the foregoing amounts.

When the pigment and/or dye are present in an amount within the above range, coloring effects and development performance may be desirable.

(F) Acrylic-based Binder Resin

The photosensitive resin composition may further include an acrylic-based binder resin to improve adherence to a substrate, heat resistance and chemical resistance, along with the dye-polymer composite (A).

The acrylic-based binder resin can be a copolymer of a first ethylenic unsaturated monomer and a second ethylenic unsaturated monomer, and is a resin including at least one acrylic-based repeating unit.

The first ethylenic unsaturated monomer can be an ethylenic unsaturated monomer including at least one carboxyl group. Examples of the first ethylenic unsaturated monomer can include without limitation acrylic acid, methacrylic acid, maleic acid, itaconic acid, fumaric acid, and the like, and combinations thereof.

The acrylic-based binder resin can include the first ethylenic unsaturated monomer in an amount of about 5 to about 50 wt %, for example about 10 to about 40 wt %, based on the total amount (weight) of the acrylic-based binder resin. In some embodiments, the acrylic-based binder resin can include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation alkenyl aromatic monomers, unsaturated carbonic acid ester compounds, unsaturated carbonic acid amino alkyl ester compounds, carbonic acid vinyl ester compounds, unsaturated carbonic acid glycidyl ester compounds, vinyl cyanide compounds, unsaturated amide compounds, and the like, and combinations thereof.

Examples of the alkenyl aromatic monomer may include without limitation styrene, α-methyl styrene, vinyl toluene, vinyl benzyl methylether, and the like, and combinations thereof. Examples of the unsaturated carbonic acid ester compound may include without limitation methyl acrylate, methyl methacrylate, ethyl acrylate, ethyl methacrylate, butyl acrylate, butyl methacrylate, 2-hydroxy ethyl acrylate, 2-hydroxy ethyl methacrylate, 2-hydroxy butyl acrylate, 2-hydroxy butyl methacrylate, benzyl acrylate, benzyl methacrylate, cyclohexyl acrylate, cyclohexyl methacrylate, phenyl acrylate, phenyl methacrylate, and the like, and combinations thereof. Examples of the unsaturated carbonic acid aminoalkyl ester compound may include without limitation 2-amino ethyl acrylate, 2-amino ethyl methacrylate, 2-dimethyl amino ethyl acrylate, 2-dimethyl amino ethyl methacrylate, and the like, and combinations thereof. Examples of the carbonic acid vinyl ester compound may include without limitation vinyl acetate, vinyl benzoate, and the like, and combinations thereof. Examples of the unsaturated carbonic acid glycidyl ester compound may include without limitation glycidyl acrylate, glycidyl methacrylate, and the like, and combinations thereof. Examples of the vinyl cyanide compound may include without limitation acrylonitrile, methacrylonitrile, and the like, and combinations thereof. Examples of the unsaturated amide compound may include without limitation acrylamide, methacrylamide, and the like, and combinations thereof. These second ethylenic unsaturated monomers may be used singularly or as a mixture of two or more.

Examples of the acrylic-based binder resin including a first ethylenic unsaturated monomer and a second ethylenic unsaturated monomer may include without limitation a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, a methacrylic acid/benzyl methacrylate/styrene/2-hydroxy ethyl methacrylate copolymer, and the like. They may be used singularly or as a mixture of two or more.

The acrylic-based binder resin may have a weight average molecular weight (Mw) of about 3,000 to about 150,000, for example about 5,000 to about 50,000. When the acrylic-based binder resin has a weight average molecular weight within the above ranges, a photosensitive resin composition may have excellent close contacting property with a substrate, excellent physical and chemical properties, and appropriate viscosity and thus, excellent dispersibility.

The acrylic-based binder resin in the photosensitive resin composition may have a critical influence on pixel resolution. For example, the methacrylic acid/benzyl methacrylate copolymer may clearly vary pixel resolution depending on its acid value and weight average molecular weight. For example, when the methacrylic acid/benzyl methacrylate are included in a ratio of 25/75 (w/w) and have an acid value ranging from about 15 to about 120 mgKOH/g and a weight average molecular weight ranging from about 3,000 to about 150,000, excellent pixel resolution may be accomplished.

The photosensitive resin composition may include the acrylic-based binder resin in an amount of about 1 wt % to about 20 wt %, based on the total weight of the photosensitive resin composition. In some embodiments, the photosensitive resin composition may include the acrylic-based binder resin in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of the acrylic-based binder resin can be in a range from about any of the foregoing amounts to about any other of the foregoing amounts.

When the acrylic-based binder resin is included in an amount within the above range of about 1 wt % to about 20 wt %, a film may be formed to have uniform thickness and good adherence to a substrate, and a color filter using the film may have excellent strength, heat and chemical resistances, after-image, and the like. In addition, the acrylic-based binder resin can have appropriate cross-linking and can provide excellent surface flatness.

The acrylic-based binder resin may be used with a cardo-based resin.

(G) Other Additive(s)

The photosensitive resin composition for a color filter may further include one or more other additives such as a dispersing agent, and the like, along with the (A) to (F) components.

Examples of the dispersing agent may include without limitation polyalkyleneglycols and esters thereof, polyoxyalkylenes, polyhydric alcohol ester alkylene oxide addition products, alcohol alkyleneoxide addition products, sulfonic acid esters, sulfonic acids, carboxylic acid esters, carboxylate salts, alkylamidealkyleneoxide addition products, alkylamines, and the like. They may be used singularly or as a mixture of two or more.

The photosensitive resin composition may include the dispersing agent in an amount of about 10 to about 20 parts by weight, based on about 100 parts by weight of the pigment.

Also, the photosensitive resin composition may further include a silicon-based and/or fluorine-based coating improving agent to improve coating property and foam removing property and/or it may further include an adherence improving agent to improve adherence to a substrate.

The photosensitive resin composition may include the coating improving agent and/or the adherence improving agent in an amount of about 0.01 to about 1 wt % based, on the total amount (weight) of the photosensitive resin composition.

In addition, the photosensitive resin composition may further include one or more other additives. Examples of additional additives include without limitation epoxy compounds; malonic acid; 3-amino-1,2-propanediol; silane-based coupling agents with a vinyl group or a (meth)acryloxy group; leveling agents; silicon-based surfactants; fluorine-based surfactants; radical polymerization initiators, and the like, and combinations thereof in order to prevent a stain or a spot during the coating and generation of a residue due to non-development and to control leveling. The amount of these additives may be easily adjusted by the skilled artisan depending on a desired property.

Examples of the epoxy compound may include without limitation phenol novolac epoxy resins, tetra methyl nonphenyl epoxy resins, bisphenol A-type epoxy resins, alicyclic epoxy resins, ortho-cresol novolac resins, and the like, and combinations thereof. The photosensitive resin composition may include the epoxy compound in an amount of about 0.01 to about 5 wt %, based the total amount (weight) of the photosensitive resin composition. When the epoxy compound is included in an amount within the above range, it may bring about excellent storage and process margins.

Examples of the silane-based coupling agent may include without limitation vinyl trimethoxysilane, vinyl tris(2-methoxyethoxysilane), 3-glycidoxypropyl trimethoxysilane, 2-(3,4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like, and combinations thereof.

The photosensitive resin composition may include the silane-based coupling agent in an amount of about 0.01 to about 2 wt %, based on the total amount (weight) of the photosensitive resin composition for a color filter. When the silane-based coupling agent is included in an amount within the above range, adherence, storage stability and coating properties may be improved.

The silicon-based surfactant may include a surfactant including a siloxane bond, and the like. Examples of the silicon-based surfactant may include without limitation DC3PA, SH7PA, DC11PA, SH21PA, SH28PA, 29SHPA, and SH30PA of TORAY SILICONE CO., LTD.; polyester-modified silicone oil, SH8400 of TORAY SILICONE CO., LTD; KP321, KP322, KP323, KP324, KP326, KP340, and GF of SHINETSU SILICONE CO., LTD.; TSF4445, TSF4446, TSF4452, and TSF4460 of TOSHIBA SILICONE CO., LTD.; and the like, and combinations thereof.

The fluorine-based surfactant may be a surfactant having a fluorocarbon backbone, and the like. Examples of the fluorine-based surfactant may include without limitation FULORAD FC430, and FULORAD FC431 of SUMITOMO 3M CO., LTD.; MEGAFACE F142D, MEGAFACE F171, MEGAFACE F172, MEGAFACE F173, MEGAFACE F177, MEGAFACE F183, MEGAFACE F470, MEGAFACE F475, MEGAFACE R30 of DAINIPPON INK KAGAKU KOGYO CO., LTD.; EFTOP EF301, EFTOP EF303, EFTOP EF351, and EFTOP EF352 of TOCHEM RODUCTS, CO., LTD.; SURFLON S381, SURFLON S382, SURFLON SC101, and SURFLON SC105 of ASAHI GLASS CO., LTD.; E5844 of DIKIN Finechemical Laboratory; and the like, and combinations thereof.

The silicon-based surfactant and fluorine-based surfactant may be used singularly or as a mixture of two or more.

According to another embodiment, a color filter manufactured using the photosensitive resin composition is provided.

The color filter may be applicable to electronic devices such as a liquid crystal display device, an organic light emitting diode, an image sensor, and the like.

The color filter may be fabricated by coating the aforementioned photosensitive resin composition on a substrate and patterning the coated substrate. As used herein, the patterning includes exposure and development. The exposure may be performed by radiating, for example, by exposing to a UV ray, an electron beam, or an X ray, with a wavelength in a region ranging from about 190 nm to about 450 nm, for example about 200 nm to about 400 nm.

The following examples illustrate the present invention in more detail. However, it is understood that the present invention is not limited by these examples.

SYNTHESIS EXAMPLES 1 TO 4

Synthesis of Dye-polymer Composite 2,2'-azobis(2,4-dimethylvalero nitrile) (an initiator) is put in its monomer sum of 6 wt % in a flask having a cooler and an agitator, and a dye represented by the following Chemical Formula 6 and the monomers in Table 1 are added thereto in each weight ratio noted in Table 1. 300 parts by weight of propyleneglycol monomethyletheracetate (PGMEA, a solvent) is added thereto based on 100 parts by weight of the total weight of the initiator and the monomers. The mixture is slowly agitated under a nitrogen atmosphere. The reaction solution is heated up to 90° C. and agitated for 10 hours, polymerizing a dye-polymer composite including aliphatic hydrocarbon. The dye-polymer composite (A) solution has a solid concentration of 20 wt % and a weight average molecular weight as shown in Table 1. Herein, the weight average molecular weight provided in Table 1 is a weight average molecular weight, reduced to polystyrene, measured by GPC (Gel Permeation Chromatography).

[Chemical Formula 6]

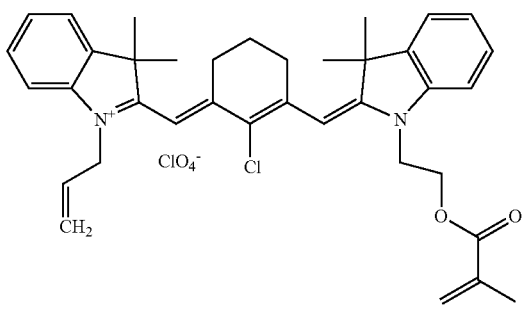

TABLE 1

|  | Synthesis Example1 | Synthesis Example2 | Synthesis Example3 | Synthesis Example4 |
| --- | --- | --- | --- | --- |
| Benzyl methacrylate | 25 | 25 | 25 | 25 |
| Methacrylic acid | 20 | 20 | 20 | 20 |
| Methyl methacrylate | 30 | 20 | 10 | 0 |
| N-benzylmaleimide | 15 | 15 | 15 | 15 |
| Dye of Chemical Formula 6 | 10 | 20 | 30 | 40 |
| Molecular weight | 6500 | 7200 | 7100 | 7500 |

Preparation of Photosensitive Dye-polymer Composite Composition for Color Filter

EXAMPLES 1 TO 4

The following components are used to prepare a photosensitive dye-polymer composite composition as follows. First of all, a photopolymerization initiator is dissolved in a solvent, and the solution is agitated at room temperature for 2 hours. Next, each polymerized dye-polymer composite according to Synthesis Examples 1 to 4 and an acrylic-based photopolymerizable monomer are added to the agitated reactant. The mixture is agitated at room temperature for 2 hours. Then, a colorant is added to the agitated reactant. The resulting mixture is agitated at room temperature for one hour, preparing a photosensitive dye-polymer composite composition for a color filter. The solution is three times filtered to remove impurities.

TABLE 2

| Composition [content (g)] | Example 1 | Example 2 | Example 3 | Example 4 |
| --- | --- | --- | --- | --- |
| (A) dye-polymer composite (copolymers polymerized in Synthesis Examples 1 to 4) | 5 | 5.5 | 6 | 7.5 |
| (B) acrylic-based photopolymerizable monomer dipentaerythritol hexaacrylate (DPHA) | 5 | 5 | 5 | 5 |
| (C) photopolymerization initiator IGACURE OXE02 (made by BASF) | 1.5 | 1.5 | 1.5 | 1.5 |
| (D) colorant Victoria Blue B (made by Fluka, blue dye) | 2.5 | 2.0 | 1.5 | — |
| (E) solvent | 70.9 | 70.9 | 70.9 | 70.9 |
| PGMEA | 46.9 | 46.9 | 46.9 | 46.9 |
| Cyclohexanone | 30 | 30 | 30 | 30 |
| (F) acrylic-based binder resin NPR-1120 (Miwon Commercial Co., Ltd) | 15.0 | 15.0 | 15.0 | 15.0 |
| (G) additive F-475 (DIC, fluorine-based surfactant) | 0.1 | 0.1 | 0.1 | 0.1 |

COMPARATIVE EXAMPLES 1 AND 2

A photosensitive resin composition for a color filter is prepared according to the same method as Example 1 using components and amounts provided in Table 3.

TABLE 3

| Composition [content (g)] | Comparative Example 1 | Comparative Example 2 |
| --- | --- | --- |
| (A) dye of Chemical Formula 6 | 5 | 5 |
| (B) acrylic-based photopolymerizable monomer dipentaerythritol hexaacrylate (DPHA) | 5 | 5 |
| (C) photopolymerization initiator IGACURE OXE02 (made by BASF) | 1.5 | 1.5 |
| (D) colorant | 2.5 | — |
| Victoria Blue B (made by Fluka, blue dye) | | |
| B15:6 (Mikuni, blue pigment) | — | 2.5 |
| (E) solvent | 70.9 | 70.9 |
| PGMEA | 40.9 | 40.9 |
| Cyclohexanone | 30 | 30 |
| (F)acrylic-based binder resin NPR-1120 (Miwon Commercial Co., Ltd) | 15 | 15 |
| (G) additive F-475 (made by DIC, fluorine-based surfactant) | 0.1 | 0.1 |

Formation of Color Filter Pattern

The photosensitive resin compositions according to Examples 1 to 4 and Comparative Examples 1 and 2, respectively, are coated to be 3 μm thick on a transparent circular glass substrate (a bare glass) using a spin-coater (K-Spin8, KDNS Co., Ltd.). The coated substrate is soft-baked at 80° C. for 150 seconds on a hot-plate, exposed to a light with an power output of 60 mJ using an exposer (Nikon Corporation I10C), developed at 25° C. for 60 seconds using a potassium hydroxide aqueous solution with a concentration of 1 wt % and cleaning it for 60 seconds and spin-drying it for 25 seconds, forming a plurality of color filter patterns.

(Properties Evaluation)

Chemical Resistance

The color filter patterns formed by using the photosensitive resin compositions according to Examples 1 to 4 and Comparative Examples 1 and 2 are dipped in a 70° C. stripper (PRS-2000, J. T. Baker Inc.) for 10 minutes and measured for chemical resistance against the stripper.

The chemical resistance is evaluated by color change of the color filter patterns before and after being dipped in the stripper and peeling of the color filter patterns after being dipped in the stripper.

The color change of the color filter patterns is measured using a spectrophotometer (MCPD3000, Otsuka Electronics Co., Ltd.), and the peeling thereof is evaluated using an optical microscope.

TABLE 4

|  | Color changes Bare glass | Peeling state Bare glass |
|---|---|---|
| Example 1 | average | bad |
| Example 2 | bad | bad |
| Example 3 | excellent | bad |
| Example 4 | excellent | excellent |
| Comparative Example 1 | bad | Bad |
| Comparative Example 2 | bad | bad |

<Color Change>
weak color change after treatment with a stripper: excellent
medium color change after treatment with a stripper: average
strong color change after treatment with a stripper: bad
<Peeling State>
no peeling of a photosensitive resin composition film: excellent
partial peeling of a photosensitive resin composition film: average
mostly peeling of a photosensitive resin composition film: bad
Heat Resistance
Color filter patterns formed using the photosensitive resin compositions according to Examples 1 to 4 and Comparative Examples 1 and 2 are heat-treated in a 230° C. oven for 30 minutes and evaluated for heat resistance.

The heat resistance is evaluated by color change of the color filter patterns before and after the heat treatment and measured using a spectrophotometer (MCPD3000, Otsuka Electronics Co., Ltd.).

TABLE 5

|  | Heat resistance Bare glass |
|---|---|
| Example 1 | Average |
| Example 2 | Average |
| Example 3 | Average |
| Example 4 | Excellent |
| Comparative Example 1 | Bad |
| Comparative Example 2 | Average |

<Heat Resistance>
Weak color change after heat treatment in a 230° C. oven for 2 hours:
Excellent
Medium color change after heat treatment in a 230° C. oven for 2 hours:
Average
Strong color change after heat treatment in a 230° C. oven for 2 hours:
Bad As shown in Tables 4 to 5, films formed using the photosensitive resin composition according to Examples 1 to 4, respectively, have little color change after treatment with a stripper, no peeling, and excellent heat resistance as compared with films formed using the photosensitive resin composition according to Comparative Examples 1 and 2. The examples demonstrate that photosensitive resin compositions according to these exemplary embodiments have excellent peeling and heat resistance.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising:
 a dye-polymer composite including a structural unit derived from a compound represented by the following Chemical Formula 1;
 (B) an acrylic-based photopolymerizable monomer;
 (C) a photopolymerization initiator; and
 (D) a solvent:

[Chemical Formula 1]

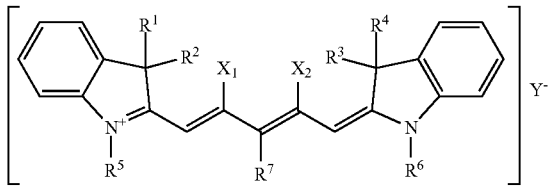

wherein, in Chemical Formula 1, $X_1$ and $X_2$ are the same or different and are each independently alkyl; cycloalkyl; an alkyl alcohol group; a carboxylic acid group; an alkenyl alcohol group; an alkyl carboxylic acid group; or an alkenyl carboxylic acid group, or $X_1$ and $X_2$ are linked to each other to form a C3 to C15 hydrocarbon ring, $R^1$ to $R^4$ are the same or different and are each independently substituted or unsubstituted alkyl; alkenyl; alkynyl; cycloalkyl; cycloalkenyl; cycloalkynyl; or aryl, $R^5$ to $R^7$ are the same or different and are each independently halogen, a carboxylic acid group; an alkyl halogen; a sulfonic acid group; an alkylsulfonic acid group; an alkenylsulfonic acid group; sulfoneimide group; an alkylsulfoneimide group; an alkylalcohol group; an alkenyl alcohol group; an alkyl carboxylic acid group; an alkenyl carboxylic acid group; alkoxy alkylsulfonic acid group; an alkoxy alkenyl sulfonic acid group; an alkoxy alkynyl sulfonic acid group; an alkoxy alkyl carboxylic acid group; an alkoxy alkenyl carboxylic acid group; or alkoxy alkynyl carboxylic acid group, provided that at least one of $R^5$ and $R^6$ includes a functional group represented by the following Chemical Formula 2 at the terminal end,

[Chemical Formula 2]

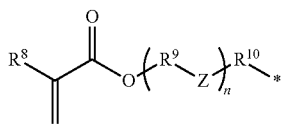

[Chemical Formula 5]

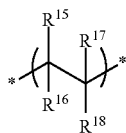

wherein, in Chemical Formula 2,
$R^8$ is hydrogen or substituted or unsubstituted C1 to C30 alkyl,
$R^9$ is substituted or unsubstituted C1 to C30 alkylene,
$R^{10}$ is a single bond or substituted or unsubstituted C1 to C30 alkyl,
Z is —N(H)—, —S—, or —O—,
n is an integer ranging from 0 to 10, and
$Y^-$ is a counter ion of $N^+$.

2. The photosensitive resin composition for a color filter of claim 1, wherein Y— is $F^-$, $Br^-$, $Cl^-$, $I^-$, perchlorate, hexafluorophosphate, or sulfoneimide group.

3. The photosensitive resin composition for a color filter of claim 1, wherein the photosensitive resin composition for a color filter comprises:
about 0.1 to about 50 wt % of the dye-polymer composite (A) including a structural unit derived from a compound represented by the above Chemical Formula 1;
about 0.5 to about 20 wt % of the acrylic-based photopolymerizable monomer (B);
about 0.1 to about 10 wt % of the photopolymerization initiator (C); and
balance of the solvent (D).

4. The photosensitive resin composition for a color filter of claim 1, wherein the dye-polymer composite (A) has a weight average molecular weight (Mw) of about 1,000 to about 500,000.

5. The photosensitive resin composition for a color filter of claim 1, wherein the dye-polymer composite (A) comprises at least one of the structural units represented by the following Chemical Formulae 3 to 5, or a combination thereof:

[Chemical Formula 3]

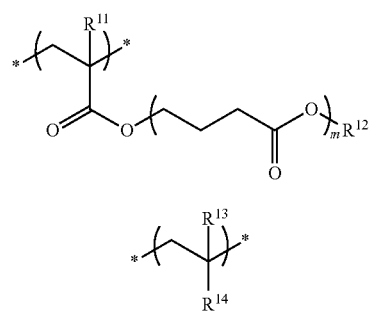

[Chemical Formula 4]

wherein, in Chemical Formulae 3 to 5,
$R^{11}$, $R^{12}$, $R^{13}$, $R^{15}$, and $R^{16}$ are the same or different and are independently hydrogen, substituted or unsubstituted C1 to C30 alkyl, substituted or unsubstituted C6 to C30 aryl, substituted or unsubstituted C6 to C30 alkylaryl, or a combination thereof,
$R^{14}$ is substituted or unsubstituted C1 to C30 alkyl, substituted or unsubstituted C6 to C30 aryl, —CO—$R^{19}$—COOH, or a combination thereof, wherein $R^{19}$ is substituted or unsubstituted C1 to C30 alkylene or substituted or unsubstituted C1 to C30 alkoxylene,
$R^{17}$ is —COOH or —CONH$R^{20}$, wherein $R^{20}$ is substituted or unsubstituted C1 to C30 alkyl or substituted or unsubstituted C6 to C30 aryl,
$R^{18}$ is —COOH, or
$R^{17}$ and $R^{18}$ are fused to each other to form a ring, and
m is an integer of 0 to 5.

6. The photosensitive resin composition for a color filter of claim 5, wherein the dye-polymer composite (A) comprises the above Chemical Formulae 3 to 5 in amounts of o, p and q moles, respectively, and wherein o, p, and q are in the following ranges: $0 \leq o \leq 80$, $0 \leq p \leq 80$, and $0 \leq q \leq 80$.

7. The photosensitive resin composition for a color filter of claim 5, wherein the dye-polymer composite (A) includes at least one of the structural units represented by the above Chemical Formulae 3 to 5 in an amount of about 0.1 to about 50 wt %, based on the total weight of the dye-polymer composite (A).

8. The photosensitive resin composition for a color filter of claim 1, wherein the photosensitive resin composition for a color filter further comprises a pigment, a dye, or a combination thereof.

9. The photosensitive resin composition for a color filter of claim 1, wherein the photosensitive resin composition for a color filter further comprises an acrylic-based binder resin.

10. The photosensitive resin composition for a color filter of claim 9, comprising the acrylic-based binder resin in an amount of about 1 to about 20 wt % based on the total weight of the photosensitive resin composition for a color filter.

11. The photosensitive resin composition for a color filter of claim 1, wherein the photosensitive resin composition for a color filter further comprises a dispersing agent; an epoxy compound; malonic acid; 3-amino-1,2-propanediol; a silane-based coupling agent with a vinyl group or a (meth)acryloxy group; a leveling agent; a silicon-based surfactant; a fluorine-based surfactant; a radical polymerization initiator, or a mixture thereof.

12. A color filter manufactured using the photosensitive resin composition for a color filter according to claim 1.

* * * * *